(12) United States Patent
Ooyabu et al.

(10) Patent No.: US 10,028,370 B2
(45) Date of Patent: Jul. 17, 2018

(54) SUSPENSION BOARD AND LOAD BEAM COMBINATION INCLUDING A POSITIONING REFERENCE HOLE AND A REINFORCING LAYER

(71) Applicant: NITTO DENKO CORPORATION, Osaka (JP)

(72) Inventors: Yasunari Ooyabu, Osaka (JP); Tetsuya Ohsawa, Osaka (JP); Emiko Tani, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 311 days.

(21) Appl. No.: 14/686,143

(22) Filed: Apr. 14, 2015

(65) Prior Publication Data

US 2015/0264795 A1    Sep. 17, 2015

Related U.S. Application Data

(62) Division of application No. 12/458,996, filed on Jul. 29, 2009, now Pat. No. 9,072,207.

(Continued)

(30) Foreign Application Priority Data

Aug. 6, 2008    (JP) ................. 2008-202666

(51) Int. Cl.
*G11B 5/48*    (2006.01)
*H05K 1/02*    (2006.01)
(Continued)

(52) U.S. Cl.
CPC ............... *H05K 1/02* (2013.01); *G11B 5/484* (2013.01); *G11B 5/4826* (2013.01);
(Continued)

(58) Field of Classification Search
CPC .... G11B 5/4826; G11B 5/4833; G11B 5/4853
(Continued)

(56) References Cited

U.S. PATENT DOCUMENTS 5,815,347 A    9/1998 Pattanaik
5,952,716 A    9/1999 Dibble et al.
(Continued)

FOREIGN PATENT DOCUMENTS

JP    63-152134 A    6/1988
JP    64-019517    1/1989
(Continued)

OTHER PUBLICATIONS

Notification of Reasons for Refusal dated Jul. 26, 2011 in Japanese Patent Application No. 2008-202666.
(Continued)

*Primary Examiner* — Jefferson Evans
(74) *Attorney, Agent, or Firm* — Edwards Neils, LLC; Jean C. Edwards, Esq.

(57) ABSTRACT

A suspension board with circuit includes a metal supporting board, a conductive layer laminated on the metal supporting board, and a via layer interposed between the metal supporting board and the conductive layer. The conductive layer includes a conductive pattern, and a reference portion serving as a positioning reference for placing the suspension board with circuit on a load beam.

5 Claims, 14 Drawing Sheets

Related U.S. Application Data

(60) Provisional application No. 61/136,258, filed on Aug. 22, 2008.

(51) Int. Cl.
| | | |
|---|---|---|
| *H05K 3/40* | (2006.01) | |
| *H05K 3/06* | (2006.01) | |
| *H05K 1/05* | (2006.01) | |
| *H05K 3/00* | (2006.01) | |

(52) U.S. Cl.
CPC .......... *G11B 5/4833* (2013.01); *G11B 5/4853* (2013.01); *H05K 1/0266* (2013.01); *H05K 3/06* (2013.01); *H05K 3/4092* (2013.01); *H05K 1/056* (2013.01); *H05K 3/0041* (2013.01); *H05K 2201/09063* (2013.01); *H05K 2201/0969* (2013.01); *H05K 2203/0502* (2013.01); *H05K 2203/0756* (2013.01); *H05K 2203/167* (2013.01)

(58) Field of Classification Search
USPC ................................ 360/244.1, 245.2, 245.9
See application file for complete search history.

(56) References Cited

U.S. PATENT DOCUMENTS

| | | | |
|---|---|---|---|
| 6,055,133 A | 4/2000 | Albrecht et al. | |
| 6,367,144 B1 | 4/2002 | Holaway et al. | |
| 6,388,883 B1 | 5/2002 | Serizawa et al. | |
| 6,399,899 B1 | 6/2002 | Ohkawa et al. | |
| 6,522,503 B2 | 2/2003 | Takadera et al. | |
| 7,315,435 B1 | 1/2008 | Pan | |
| 7,441,323 B1 | 10/2008 | Wolter | |
| 7,697,237 B1 | 4/2010 | Danielson | |
| 8,325,446 B1* | 12/2012 | Liu ...................... | G11B 5/4833 360/245.9 |
| 9,072,207 B2* | 6/2015 | Ooyabu ................. | G11B 5/484 |
| 2002/0007961 A1 | 1/2002 | Yamato et al. | |
| 2003/0064636 A1 | 4/2003 | Fujita et al. | |
| 2004/0187296 A1 | 9/2004 | Cowles et al. | |
| 2005/0138794 A1* | 6/2005 | Yao ...................... | G11B 5/4833 29/603.03 |
| 2006/0087011 A1 | 4/2006 | Kanagawa et al. | |
| 2006/0118330 A1 | 6/2006 | Ooyabu et al. | |
| 2008/0049360 A1 | 2/2008 | Fujiwara et al. | |
| 2011/0048785 A1* | 3/2011 | Ishii ...................... | G11B 5/484 174/261 |
| 2012/0075741 A1* | 3/2012 | Ho ...................... | G11B 5/5569 360/75 |
| 2015/0156892 A1* | 6/2015 | Tanabe ................. | H05K 3/4661 205/125 |
| 2016/0329066 A1* | 11/2016 | Shum .................... | G11B 5/4873 |
| 2016/0351215 A1* | 12/2016 | Tanaka ................. | G11B 5/4826 |

FOREIGN PATENT DOCUMENTS

| | | |
|---|---|---|
| JP | 02-150044 A | 6/1990 |
| JP | 02-110361 U | 9/1990 |
| JP | 3-115911 | 5/1991 |
| JP | H03-276653 A | 12/1991 |
| JP | H04-72629 U | 6/1992 |
| JP | 05-335373 A | 12/1993 |
| JP | 7-129944 | 5/1995 |
| JP | 2003-017815 A | 1/2003 |
| JP | 2006-093228 | 4/2006 |
| JP | 2006-209853 | 8/2006 |
| JP | 2008-052779 | 3/2008 |

OTHER PUBLICATIONS

Notification of Reasons for Refusal dated Apr. 10, 2012 in Japanese Patent Application No. 2008-202666.

Office Action, issued by the Chinese State Intellectual Property Office (SIPO) dated Mar. 25, 2013 in connection with Chinese Patent Application No. 200910159277.8.

Office Action issued by SIPO dated Sep. 12, 2013 in connection with corresponding Chinese Patent Application No. 200910159277.8.

Notice of Allowance dated Jan. 28, 2014 by the Japanese Patent Office in connection with Japanese Patent Application No. 2012-238748.

Office Action issued by SIPO dated Apr. 14, 2014 in connection with corresponding Chinese Patent Application No. 200910159277.8.

Non-Final Office Action dated Dec. 7, 2011 in connection with U.S. Appl. No. 12/458,996.

Final Office Action dated May 1, 2012 in connection with U.S. Appl. No. 12/458,996.

Non-Final Office Action dated Jul. 30, 2013 in connection with U.S. Appl. No. 12/458,996.

Final Office Action dated Dec. 20, 2013 in connection with U.S. Appl. No. 12/458,996.

Non-Final Office Action dated Aug. 13, 2014 in connection with U.S. Appl. No. 12/458,996.

Final Office Action dated Jan. 14, 2015 in connection with U.S. Appl. No. 12/458,996.

* cited by examiner

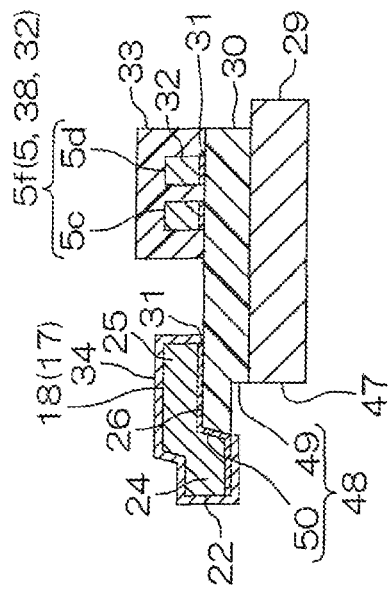
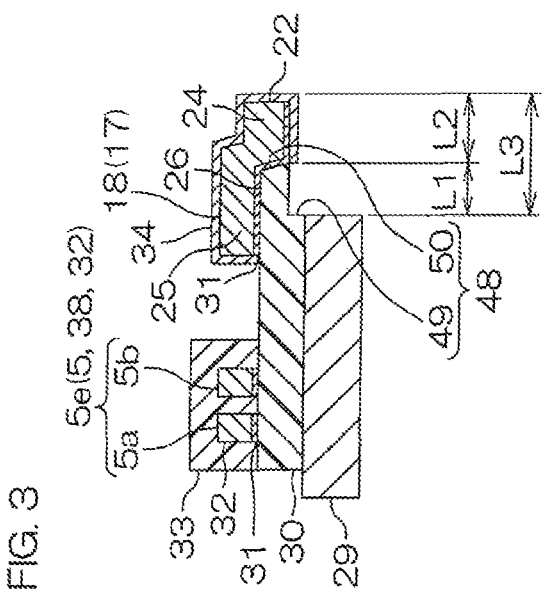
FIG. 3

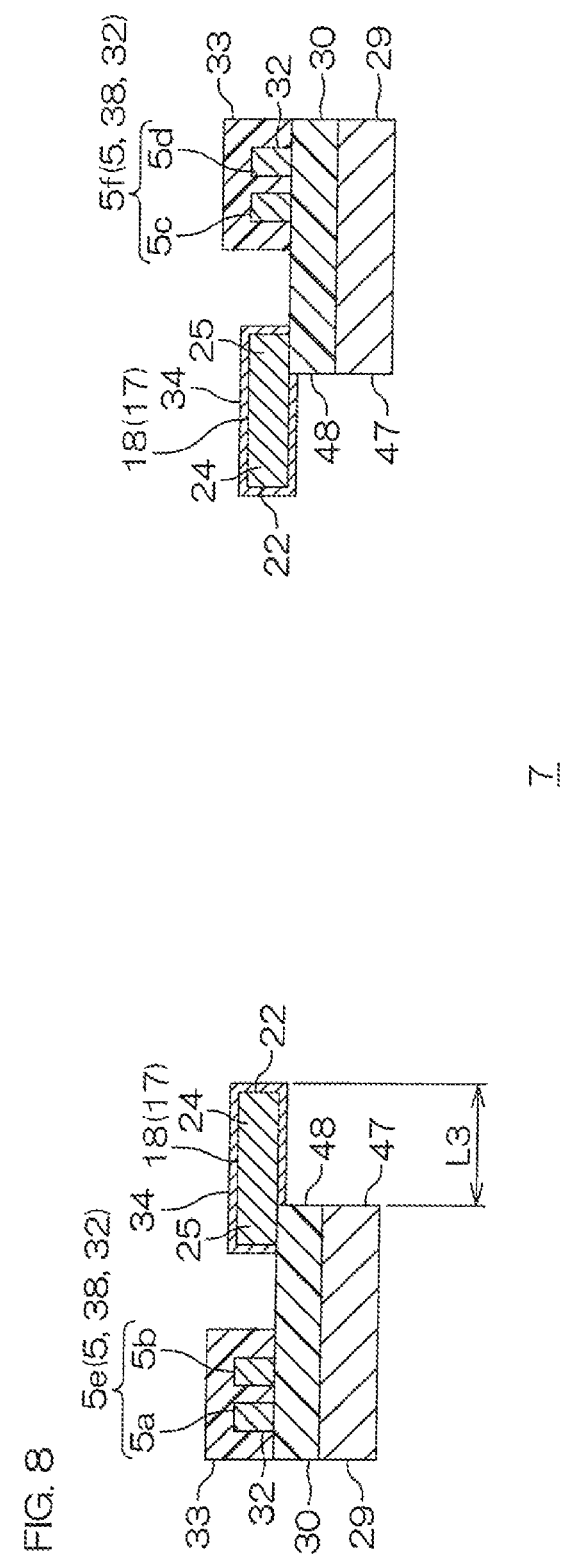

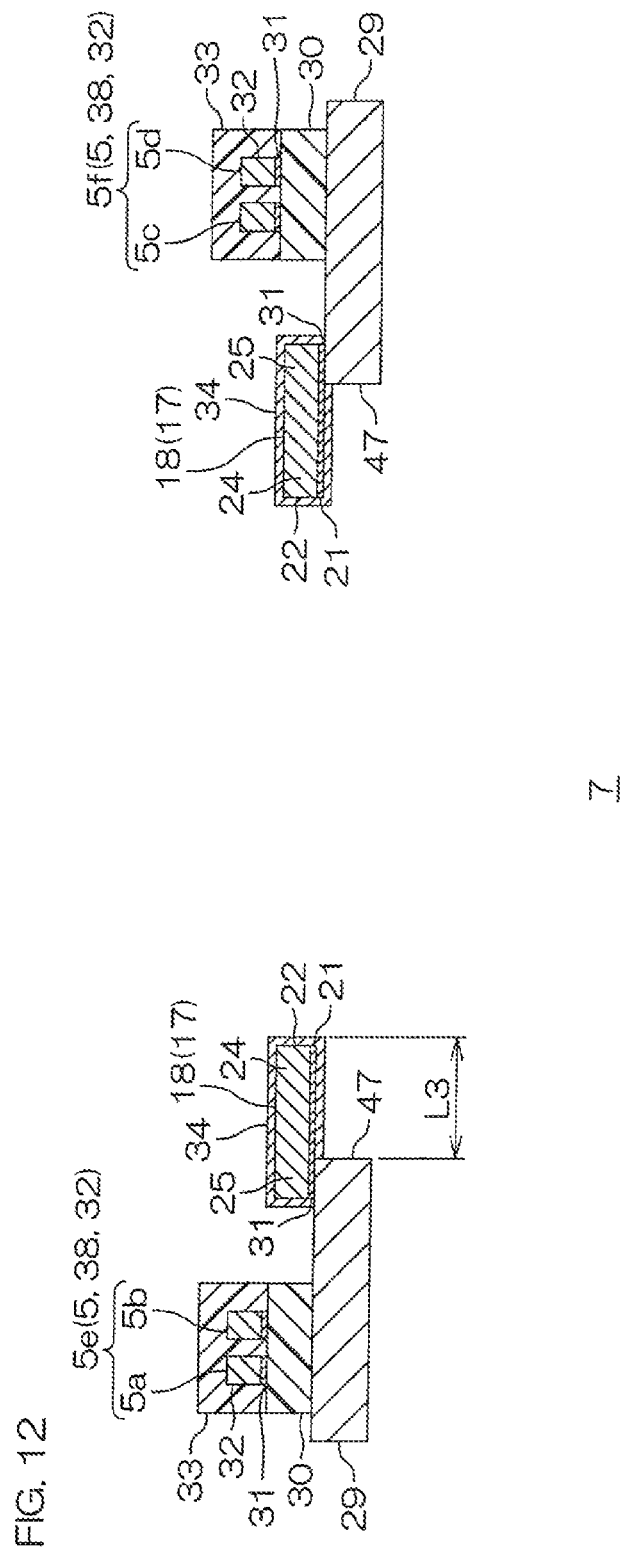

SUSPENSION BOARD AND LOAD BEAM COMBINATION INCLUDING A POSITIONING REFERENCE HOLE AND A REINFORCING LAYER

CROSS-REFERENCE TO RELATED APPLICATIONS

This patent application is a divisional application of U.S. patent application Ser. No. 12/458,996, filed Jul. 29, 2009, which claims the benefit of U.S. Provisional Application No. 61/136,258, filed on Aug. 22, 2008, and claims priority from Japanese Patent Application No. 2008-202666, filed on Aug. 6, 2008, the contents of which are herein incorporated by reference in their entirety.

BACKGROUND OF THE INVENTION

Field of the Invention

The present invention relates to a suspension board with circuit, a producing method thereof, and a positioning method of the suspension board with circuit and, more particularly, to a suspension board with circuit which is used appropriately in a hard disk drive, a producing method thereof, and a positioning method of the suspension board with circuit.

Description of the Related Art

Conventionally, in a hard disk drive, a suspension board with circuit on which a slider is mounted is placed on a load beam. A magnetic head mounted on the slider travels relatively to a magnetic disk, while holding a minute gap therebetween. To ensure stable traveling of the magnetic head, it is required to precisely position the load beam, the suspension board with circuit placed thereon, and the slider mounted on the suspension board with circuit with respect to each other.

For example, it has been proposed that, in a suspension including a flexure extending in a longitudinal direction, and a wiring portion formed thereon and having a conductive layer and pads (electrodes), the flexure is positioned with respect to a load beam by inserting first and second locating pins into first and second locating holes formed in the flexor (see, e.g., Japanese Unexamined Patent Publication No. 2008-52779).

SUMMARY OF THE INVENTION

However, in the suspension described in Japanese Unexamined Patent Publication No. 2008-52779, the positioning holes mentioned above are formed in the flexure irrespective of the locations of the pads. Accordingly, positional accuracy associated with relative positioning of a magnetic head connected to the pads and the load beam includes two tolerances which are the tolerance in forming the positioning holes in the flexor, and the tolerance in forming the pads on the flexor. As a result, there is a limit to precisely position the magnetic head and the load beam.

It is therefore an object of the present invention to provide a suspension board with circuit which can allow precise positioning of a load beam, the suspension board with circuit placed thereon, and a slider mounted thereon, a producing method thereof, and a positioning method of the suspension board with circuit.

A suspension board with circuit of the present invention includes a metal supporting board, a conductive layer laminated on the metal supporting board, and a via layer interposed between the metal supporting board and the conductive layer, wherein the conductive layer includes a conductive pattern, and a reference portion serving as a positioning reference for placing the suspension board with circuit on a load beam.

In the suspension board with circuit of the present invention, it is preferable that the reference portion includes a reference hole extending through the conductive layer in a thickness direction.

In the suspension board with circuit of the present invention, it is preferable that a via hole is formed in the via layer to extend therethrough in the thickness direction, the via hole is formed at the same position as that of the reference hole, or includes the reference hole when projected in the thickness direction, a board hole is formed in the metal supporting board to extend therethrough in the thickness direction, and the board hole includes the reference hole when projected in the thickness direction.

A producing method of a suspension board with circuit of the present invention includes the step of forming, from a conductive layer and on a via layer formed on a metal supporting board, a conductive pattern, and a reference portion serving as a positioning reference for placing the suspension board with circuit on a load beam, wherein, in the step of forming the conductive pattern and the reference portion, the conductive pattern and the reference portion are simultaneously formed.

In the producing method of the suspension board with circuit of the present invention, it is preferable that the via layer is an insulating layer, and the step of forming the conductive pattern and the reference portion includes forming a seed film on the insulating layer and on the metal supporting board exposed from the insulating layer, laminating a photoresist on the seed film, exposing the photoresist to light via a photomask, and then developing the photoresist to form a plating resist in a pattern reverse to the conductive pattern and to a pattern of the reference portion, laminating the conductive pattern and the reference portion on the seed film exposed from the plating resist, removing the plating resist, and removing the seed film exposed from the conductive pattern and from the reference portion.

In the producing method of the suspension board with circuit of the present invention, it is preferable that the via layer is an insulating layer, and the step of forming the conductive pattern and the reference portion includes laminating a photoresist on the conductive layer laminated on the insulating layer, exposing the photoresist to light via a photomask, and then developing the photoresist to form an etching resist in the same pattern as the conductive pattern and as a pattern of the reference portion, etching the conductive layer exposed from the etching resist to form the conductive pattern and the reference portion, and removing the etching resist.

In the producing method of the suspension board with circuit of the present invention, it is preferable that, in the step of forming the conductive pattern and the reference portion, the photoresist is exposed to light via a single photomask.

In the producing method of the suspension board with circuit of the present invention, it is preferable that the reference portion includes a reference hole extending through the conductive layer in a thickness direction, the producing method further comprising the steps of forming, in the via layer, a via hole extending through the conductive layer in the thickness direction such that the via hole is at the same position as that of the reference hole, or includes the reference hole when projected in the thickness direction, and forming, in the metal supporting board, a board hole extending through the metal supporting board in the thickness direction such that the board hole includes the reference hole when projected in the thickness direction.

A positioning method of a suspension board with circuit, wherein a suspension board with circuit comprises a metal supporting board; a conductive layer laminated on the metal supporting board; and a via layer interposed between the metal supporting board and the conductive layer, wherein the conductive layer includes a conductive pattern, and a reference portion serving as a positioning reference for placing the suspension board with circuit on a load beam, wherein the suspension board with circuit is positioned with respect to the load beam using the reference portion as the positioning reference.

In the suspension board with circuit of the present invention which is obtained according to the producing method of the suspension board with circuit of the present invention, the reference portion is formed together with the conductive pattern from the conductive layer to be in the same layer.

As a result, the reference portion serving as the positioning reference for placing the suspension board with circuit on the load beam, and the conductive pattern to be connected to a slider are positioned relatively to each other with high accuracy.

In the positioning method of the suspension board with circuit of the present invention, when the suspension board with circuit of the present invention is positioned with respect to the load beam using the reference portion as the positioning reference, and the slider is connected to the conductive pattern, it is possible to position the load beam, the suspension board with circuit, and the slider relatively to each other with high positional accuracy.

BRIEF DESCRIPTION OF THE DRAWINGS

FIG. 3 is a cross-sectional view along the line A-A of a first reference portion shown in FIG. 2;

FIG. 8 is a cross-sectional view along a widthwise direction of the first reference portion of another embodiment of the suspension board with circuit of the present invention;

FIG. 12 is a cross-sectional view along the widthwise direction of the first reference portion of still another embodiment of the suspension board with circuit of the present invention;

DETAILED DESCRIPTION OF THE INVENTION

Figure 1:
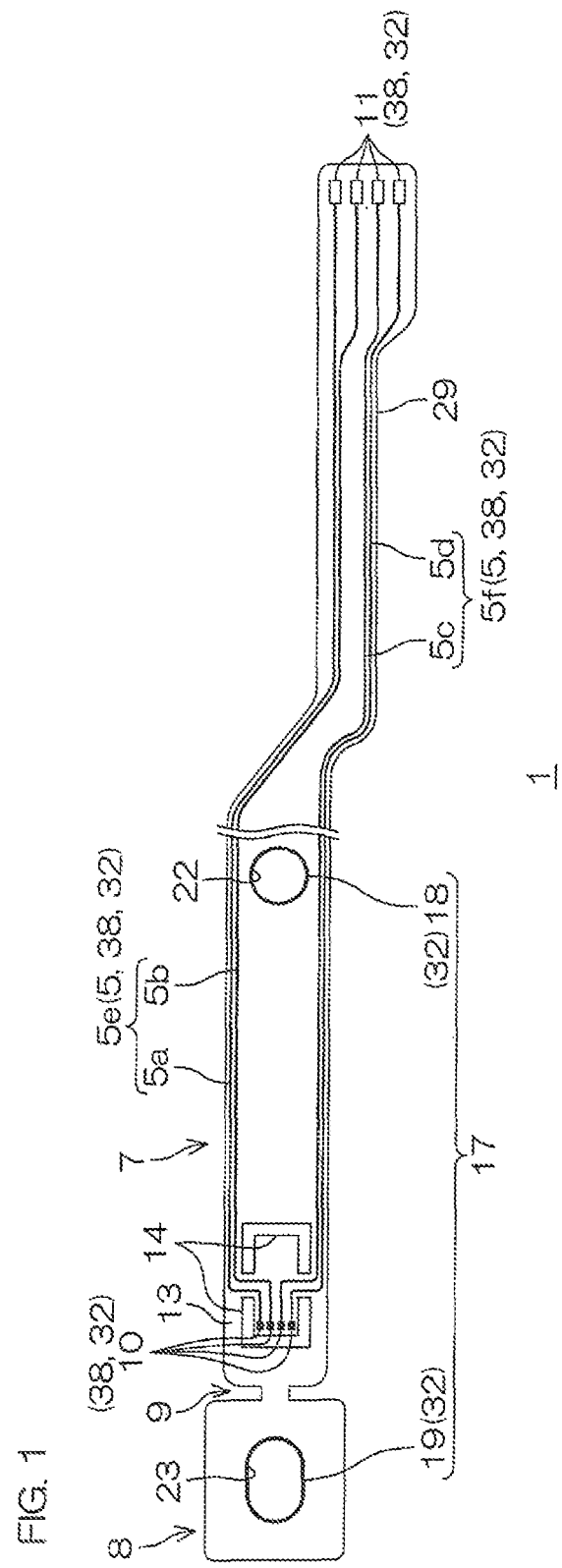
FIG. 1 is a partially cut-away plan view of an embodiment of a suspension board with circuit of the present invention.

FIG. 1 is a partially cut-away plan view of an embodiment of a suspension board with circuit of the present invention.

Figure 2:
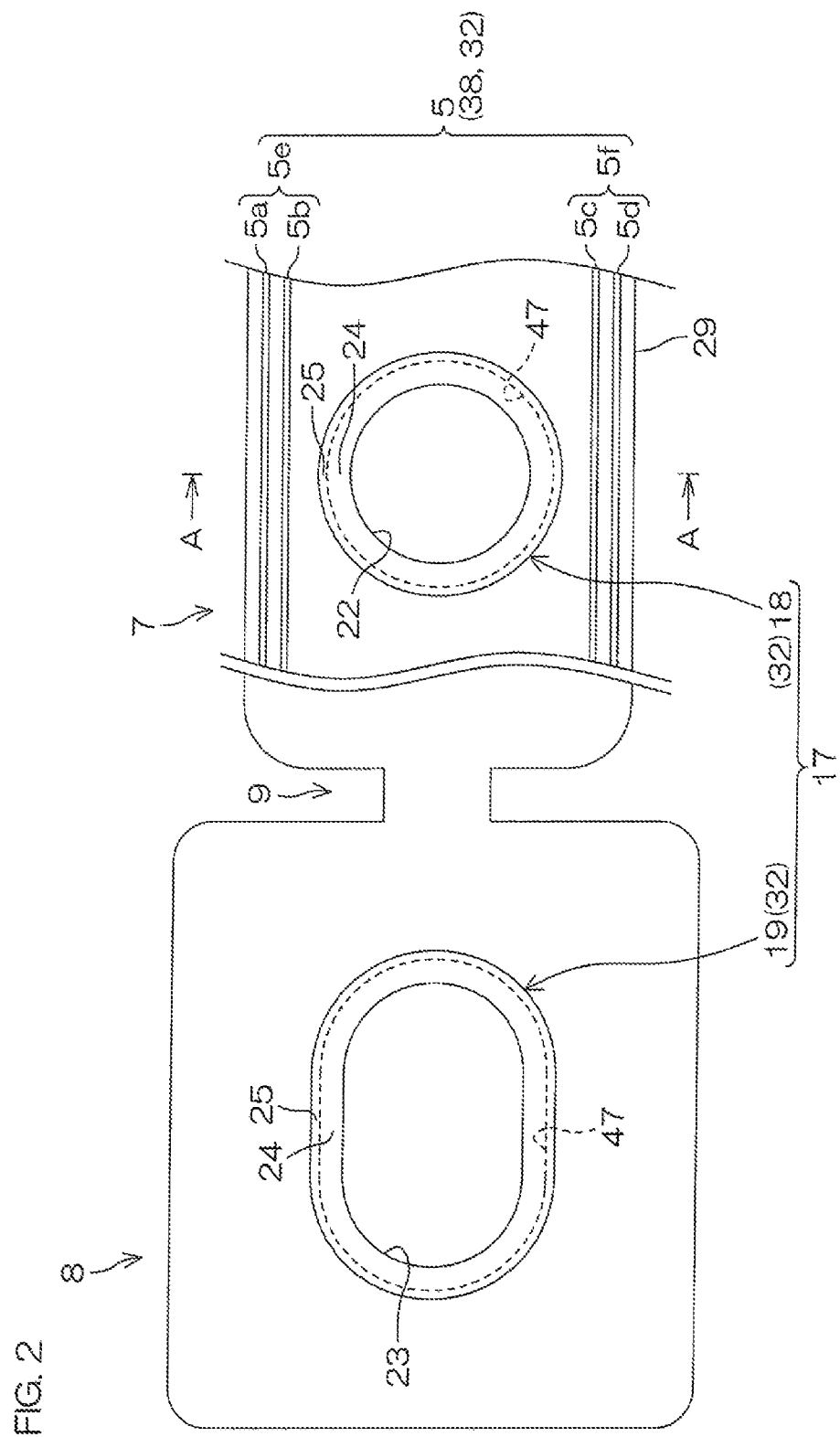
FIG. 2 is an enlarged plan view of reference portions of the suspension board with circuit shown in FIG. 1.

FIG. 2 is an enlarged plan view of reference portions of the suspension board with circuit shown in FIG. 1. FIG. 3 is a cross-sectional view along the line A-A of a first reference portion shown in FIG. 2. FIGS. 4(a) to 6(l) are production process views each for illustrating a producing method of the suspension board with circuit shown in FIG. 3. FIG. 7 is a side view for illustrating a method of placing the suspension board with circuit on a load beam described layer.

In FIGS. 1 and 2, an insulating base layer 30, a seed film 31, an insulating cover layer 33, and a reinforcing layer 34, each described later, are omitted for clear illustration of relative positioning of a conductive pattern 38 and reference portions 17, each described later.

In FIG. 1, the suspension board with circuit 1 is placed on a load beam 2 (see FIG. 7), and mounted on a hard disk (not shown). On the suspension board with circuit 1, a slider 3 (see FIG. 7) with a magnetic head 4 (see FIG. 7) mounted thereon is mounted.

The suspension board with circuit 1 is formed in a generally flat-belt plan view shape extending in a longitudinal direction. A metal supporting board 29 (described later) is formed correspondingly to the outer shape of the suspension board with circuit 1.

The suspension board with circuit 1 integrally includes a main body portion 7, an extension portion 8 formed on the front end side (one longitudinal end side) of the main body portion 7, and a to-be-removed portion 9 formed between the main body portion 7 and the extension portion 8.

The main body portion 7 is formed in a generally flat-belt plan view shape extending in the longitudinal direction.

The extension portion 8 is formed on the front end side of the main body portion 7 to be spaced apart therefrom into a generally rectangular plan view shape having a width (widthwise length perpendicular to the longitudinal direction) slightly larger than the width of the front end portion of the main body portion 7.

The to-be-removed portion 9 is interposed between the front end of the main body portion 7 and the rear end of the extension portion 8 so as to span therebetween. The to-be-removed portion 9 is formed in a generally rectangular plan view shape having a width smaller than the width of the front end portion of the main body portion 7 and the width of the rear end portion of the extension portion 8. This can allow easy removal of the to-be-removed portion 9 for separating the extension portion 8 from the main body portion 7 after the suspension board with circuit 1 is placed on the load beam 2.

On the suspension board with circuit 1, a conductive pattern 38 for connecting the magnetic head 4 (see FIG. 7) and an external board (not shown) such as a read/write board is formed.

The conductive pattern 38 is formed in the main body portion 7, and integrally includes head-side terminals 10 to be connected to terminals (not shown) of the magnetic head 4, external terminals 11 to be connected to terminals (not shown) of the external board such as the read/write board, and a plurality of wires 5 for connecting the head-side terminals 10 and the external terminals 11.

The plurality of head-side terminals 10 are disposed at the front end portion of the main body portion 7, and provided in parallel as wide lands so as to be connected to the respective front end portions of the wires 5.

The front end portion of the main body portion 7 where the head-side terminals 10 are provided is formed as a gimbal 13. In the gimbal 13, a slit 14 is formed in which the head-side terminals are interposed in the longitudinal direction.

The slit 14 is formed in a generally U-shaped plan view shape, and disposed with the head-side terminals 10 being interposed therein in a front-to-rear direction such that the open side thereof opposes the head-side terminals 10.

The plurality of external terminals 11 are disposed at the rear end portion of the main body portion 7, and provided in parallel as wide lands so as to be connected to the respective rear end portions of the wires 5.

The plurality of (e.g., four) wires 5 are provided along the longitudinal direction of the main body portion 7. The wires 5 are arranged in parallel to be spaced apart from each other in the widthwise direction of the main body portion 7. Specifically, the wires 5 include a first wire 5a, a second wire 5b, a third wire 5c, and a fourth wire 5d which are arranged in parallel in this order from one widthwise side toward the other widthwise side.

More specifically, the first wire 5a and the second wire 5b (a first pair 5e of wires) are disposed on one widthwise side, while the third wire 5c and the fourth wire 5d (a second pair 5f of wires) are disposed on the other widthwise side.

As shown in FIG. 3, the suspension board with circuit 1 includes the metal supporting board 29, the insulating base layer 30 which is an insulating layer as a via layer formed on the metal supporting board 29, the conductive pattern 38 formed on the insulating base layer 30, and the insulating cover layer 33 formed on the insulating base layer 30 so as to cover the conductive pattern 38.

The metal supporting board 29 is formed of a metal foil or a metal thin plate so as to form the outer shape of the suspension board with circuit 1, as described above.

The insulating base layer 30 is formed on substantially the entire surface of the metal supporting board 29 in the main body portion 7 and the extension portion 8.

As shown in FIG. 1, the conductive pattern 38 is formed from a conductive layer 32 (described later) as a wired circuit pattern including the head-side terminals 10, the external terminals 11, and the wires 5.

As shown in FIG. 3, the insulating cover layer 33 is formed on the surface of the insulating base layer 30 in the main body portion 7. The insulating cover layer 33 is formed in a pattern which covers the wires 5, and exposes the head-side terminals 10 and the external terminals 11.

As shown in FIG. 1, the suspension board with circuit 1 is provided with the reference portions 17 serving as a positioning reference for placing the suspension board with circuit 1 on the load beam 2.

The reference portions 17 include a first reference portion 18 and a second reference portion 19, and are formed from the conductive layer 32 (described later).

The first reference portion 18 is formed at the longitudinal and widthwise centers of the main body portion 7, and disposed between the head-side terminals 10 and the external terminals 11, and disposed between the first pair 5e of wires (the second wire 5b) and the second pair 5f of wires (the third wire 5c) to be spaced apart therefrom.

As shown in FIG. 2, the first reference portion 18 is formed in a generally annular ring plan view shape. Specifically, the first reference portion 18 is formed in a circular frame shape having generally the same radial length in a circumferential direction when viewed in plan view.

The first reference portion 18 has the inner circumferential surface thereof defining a first reference hole 22 as a reference hole extending through the first reference portion 18 in a thickness direction.

As shown in FIG. 3, in the insulating base layer 30 formed under the first reference portion 18, a base hole 48 is formed as a via hole having a diameter larger than that of the first reference hole 22.

The base hole 48 connects to the first reference hole 22 in the thickness direction, and is formed in a generally circular plan view shape which is substantially coaxial with the first reference hole 22.

The base hole 48 is formed of an upper hole 50 formed in the upper half portion of the insulating base layer 30, and having a diameter larger than that of the first reference hole 22, and a lower hole 49 formed in the lower half portion of the insulating base layer 30, and having a diameter larger than that of the upper hole 50. As a result, in the insulating base layer 30, a protruding portion 26 protruding from the circumferential surface of the lower hole 49 toward the circumferential surface of the upper hole 50 is formed in a generally annular ring shape.

Specifically, the first reference portion 18 integrally includes an outer circumferential portion 25 located on the upper surface of the protruding portion 26, and an inner circumferential portion 24 inwardly projecting from the inner circumferential surface of the protruding portion 26. The inner circumferential portion 24 is located to be lower by one step in level than the outer circumferential portion 25.

In the metal supporting board 29 formed under the base hole 48, a board hole 47 is formed to be coaxial with the lower hole 49, and have the same diameter as that of the lower hole 49.

The board hole 47 connects to the base hole 48 in the thickness direction. The board hole 47 includes the first reference hole 22 when viewed in bottom view (when projected in the thickness direction).

In the first reference portion 18, the seed film 31 and the reinforcing layer 34 are formed.

The seed film 31 is interposed between the first reference portion 18 and the insulating base layer 30 at a portion where the first reference portion 18 and the insulating base layer 30 oppose each other in the outer circumferential portion 25. The seed film 31 is formed on the lower surface of the first reference portion 18 in the inner circumferential portion 24.

The reinforcing layer 34 is formed on the surface of the first reference portion 18 and on the surface (except for the surface of the seed film 31 in the outer circumferential portion 25) of the seed film 31.

As shown in FIGS. 1 and 2, the second reference portion 19 is formed at the longitudinal and widthwise centers of the extension portion 8.

The second reference portion 19 is formed in a generally annular ring plan view shape which is slightly long in the longitudinal direction. Specifically, the second reference portion 19 is formed in an elongated-hole frame shape having generally the same widthwise length in the longitudinal direction when viewed in plan view.

The second reference portion 19 has the inner circumferential surface thereof defining a second reference hole 23 as a reference hole extending through the second reference portion 19 in the thickness direction.

As shown in FIG. 3, under the second reference portion 19, the base hole 48 obtained by opening the insulating base layer 30, and the board hole 47 obtained by opening the metal supporting board 29 are formed in the same manner as the base hole 48 and the board hole 47 under the first reference portion 18. In the second reference portion 19, the seed film 31 and the reinforcing layer 34 are formed in the same manner as in the first reference portion 18.

Next, a producing method of the suspension board with circuit 1 is described with reference to FIGS. 4(a) to 6(l).

Figure 4A:
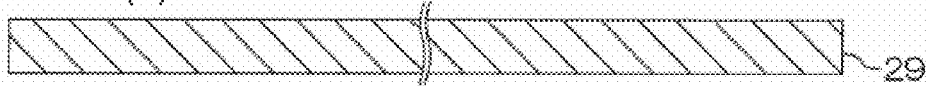
FIGS. 4(a) to 4(d) are production process views for illustrating a producing method of the suspension board with circuit shown in FIG. 3, 4(a) showing the step of preparing a metal supporting board, 4(b) showing the step of forming an insulating base layer on the metal supporting board, 4(c) showing the step of forming a seed film, and 4(d) showing the step of laminating a photoresist on the seed film.

In the method, as shown in FIG. 4(a), the metal supporting board 29 is prepared first.

Examples of a metal material used to form the metal supporting board 29 include stainless steel and a 42-alloy. Preferably, stainless steel is used. The thickness of the metal supporting board 29 is in a range of, e.g., 10 to 60 μm, or preferably 15 to 30 μm.

Figure 4B:
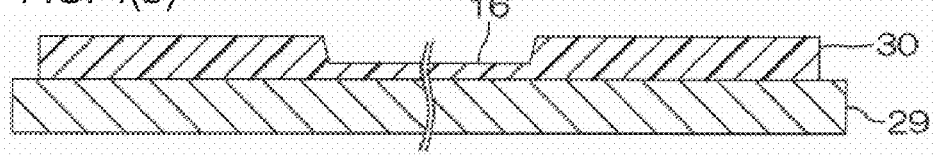

Next, as shown in FIG. 4(b) the insulating base layer 30 is formed on the metal supporting board 29. The insulating base layer 30 is formed in a pattern having a base depressed portion 16. The base depressed portion 16 is defined inwardly of a portion which serves as the protruding portion 26.

Examples of an insulating material used to form the insulating base layer 30 include synthetic resins such as polyimide, polyamideimide, acryl, polyether nitrile, polyether sulfone, polyethylene terephthalate, polyethylene naphthalate, polyvinyl chloride, and a fluorine resin. Preferably, a photosensitive synthetic resin is used, or more preferably, photosensitive polyimide is used.

To form the insulating base layer 30 using, e.g., photosensitive polyimide, a varnish (a solution of a photosensitive polyamic acid resin) of a photosensitive polyimide resin precursor is uniformly coated first on the surface of the metal supporting board 29, and dried by heating at, e.g., 70 to 120° C. to form a base coating. Then, the base coating is exposed to light via a gradation exposure photomask not shown. The gradation exposure photomask includes a light shielding portion, a light semi-transmitting portion, and a light full transmitting portion in a pattern. The light full transmitting portion is disposed to oppose the portion (except for a portion where the base depressed portion 16 is to be formed) of the base coating where the insulating base layer 30 is to be formed. The light semi-transmitting portion is disposed to oppose the portion of the base coating where the base depressed portion 16 is formed. The light shielding portion is disposed to oppose the portion of the base coating where the insulating base layer 30 is not to be formed. Thereafter, the base coating is developed, and cured as necessary to form the insulating base layer 30 having the base depressed portion 16. To form the insulating base layer 30, e.g., a solution (varnish) of any of the synthetic resins mentioned above is uniformly coated on the entire upper surface of the metal supporting board 29, dried, and then cured by heating as necessary. After that, the base depressed portion 16 can also be formed by etching or the like.

The thickness of the insulating base layer 30 is in a range of, e.g., 1 to 8 μm, or preferably 1 to 4 μm in the base depressed portion 16, and in a range of, e.g., 10 to 30 μm, or preferably 5 to 20 μm at the other portion. The dimensions of the base depressed portion 16 are such that the maximum inner diameter thereof is in a range of, e.g., 80 to 3500 μm, or preferably 100 to 2500 μm.

Next, as shown in FIGS. 4(c) to 5(h), the seed film 31, the conductive pattern 38, and the reference portions 17 (the first reference portion 18 and the second reference portion 19) are successively formed by an additive method.

Figure 4C:
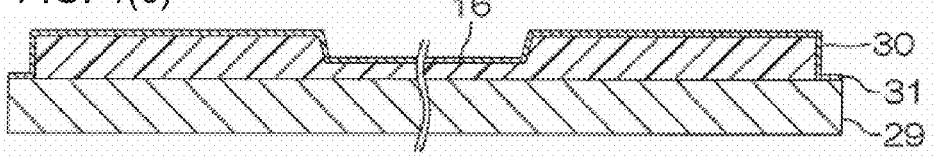

As shown in FIG. 4(c), the seed film 31 is formed on the insulating base layer 30 and on the metal supporting board 29 exposed from the insulating base layer 30.

Examples of a material used to form the seed film 31 include metal materials such as chromium, gold, silver, platinum, nickel, titanium, silicon, manganese, zirconium, an alloy thereof, and an oxide thereof. Preferably, chromium is used. The seed film 31 can also be formed of a plurality of layers.

The seed film 31 is formed by, e.g., sputtering, electrolytic plating, electroless plating, or the like. Preferably, the seed film 31 is formed by sputtering.

As the sputtering, sputtering using any of the metals mentioned above as a target is used. Preferably, chromium sputtering is used to laminate a chromium thin film.

The thickness of the seed film 31 is in a range of, e.g., 0.01 to 1 μm, or preferably 0.01 to 0.1 μm.

Figure 4D:
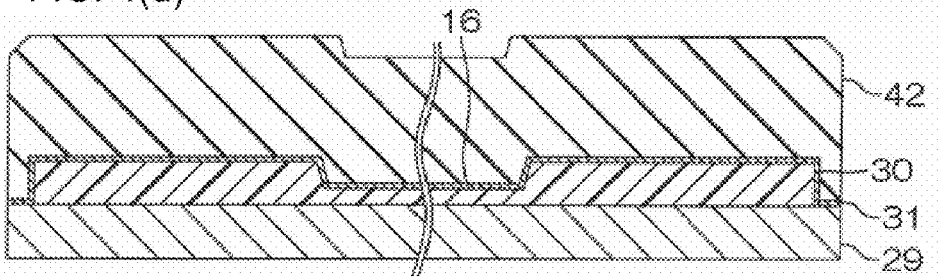

Next, as shown in FIG. 4(d), a photoresist 42 is laminated on the seed film 31.

As the photoresist 42, a dry film resist, e.g., is laminated on the surface of the seed film 31.

Figure 5E:
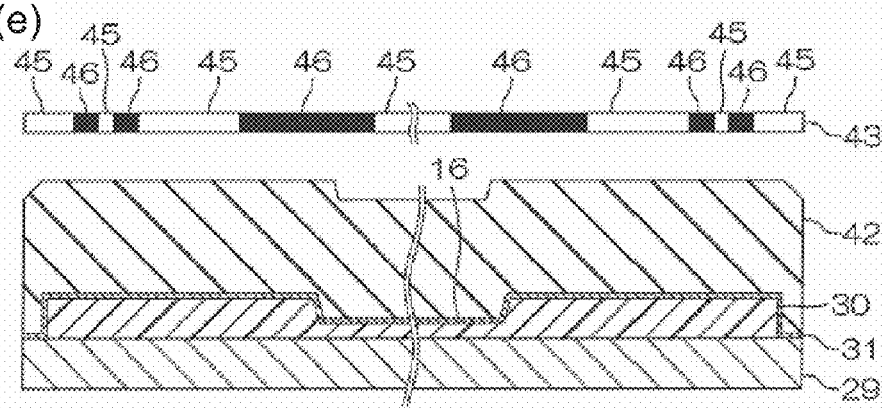
FIGS. 5(e) to 5(h) are production process views for illustrating, subsequently to FIGS. 4(a) to 4(d), the producing method of the suspension board with circuit shown in FIG. 3, 5(e) showing the step of exposing the photoresist to light via a photomask, 5(f) showing the step of developing the photoresist to form a plating resist, 5(g) showing the step of laminating a conductive layer on the seed film exposed from the plating resist, and 5(h) showing the step of removing the plating resist and the seed film.
Figure 5F:
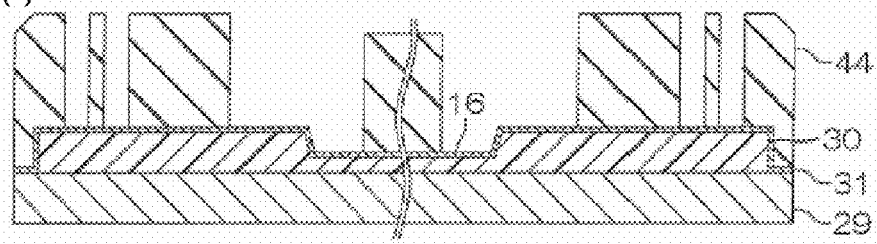

Next, as shown in FIG. 5(e), the photoresist 42 is exposed to light via a photomask 43, and then developed as shown in FIG. 5(f) to form a plating resist 44 in a pattern reverse to the conductive pattern 38 and to the patterns of the reference portions 17.

As shown in FIG. 5(e), the photomask 43 is formed as a single photomask in which a pattern for forming the conductive pattern 38 and a pattern for forming the reference portions 17 are integrally formed. Specifically, the photomask 43 includes light shielding portions 46 which do not transmit light, and light transmitting portions 45 which transmit light in the foregoing pattern. In the case of patterning with a negative image, exposure to light is performed by disposing the photomask 43 such that the light shielding portions 46 oppose portions where the conductive pattern 38 and the reference portions 17 are to be formed, and the light transmitting portions 45 oppose portions where the conductive pattern 38 and the reference portions 17 are not to be formed.

Thereafter, as shown in FIG. 5(f), unexposed portions opposing the light shielding portions 46, i.e., the portions where the conductive pattern 38 and the reference portions 17 are to be formed are removed by development. For the development, e.g., a dipping method, a spraying method, or the like is used.

In this manner, the plating resist 42 is formed in the pattern reverse to the conductive pattern 38 and to the patterns of the reference portions 17 on the surface of the seed film 31.

In the case of patterning with a positive image, exposure to light is performed by disposing the light transmitting portions 45 of the photomask 43 in opposing relation to the portions where the conductive pattern 38 and the reference portions 17 are to be formed, though not shown, in contrast with the case described above where patterning is performed with the negative image. The exposure to light is followed by development.

Figure 5G:
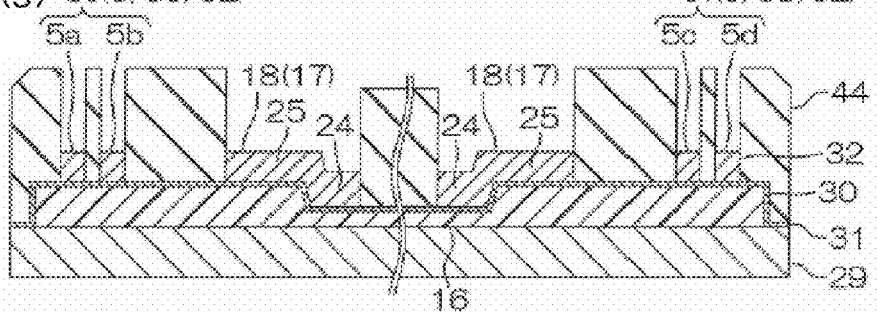

Next, as shown in FIG. 5(g), the conductive layer 32 is laminated on the seed film 31 exposed from the plating resist 44.

Examples of a conductive material used to form the conductive layer 32 include metals such as copper, nickel, gold, a solder, and an alloy thereof (e.g., a copper alloy). Among them, copper is preferably used.

The conductive layer 32 is laminated by, e.g., electrolytic plating, or preferably electrolytic copper plating.

The thickness of the conductive layer 32 is in a range of, e.g., 5 to 20 μm, or preferably 5 to 15 μm.

Figure 5H:
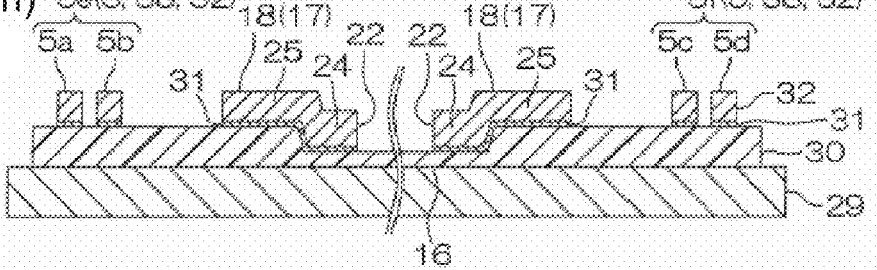

Next, as shown in FIG. 5(h), the plating resist 44 is removed by, e.g., etching, stripping, or the like. Subsequently, the seed film 31 exposed from the conductive layer 32 is removed by, e.g., etching, stripping, or the like.

In this manner, the conductive pattern 38 and the reference portions 17, each made of the conductive layer 32, are simultaneously formed.

The reference portions 17 (the first reference portion 18 and the second reference portion 19) are each formed such that the maximum inner diameter thereof (the maximum inner diameter of the reference hole (the first reference hole 22 or the second reference hole 23)) is larger by, e.g., 1 to 20 μm than the outer diameter of a pin (a first pin 27 or a second pin 28) described later. Specifically, the maximum inner diameter of each of the reference portions 17 is in a range of, e.g., 50 to 3000 μm, or preferably 100 to 2000 μm. The maximum outer diameter of each of the reference portions 17 (the first reference portion 18 and the second reference portion 19) is in a range of, e.g., 80 to 5000 μm, or preferably 150 to 2600 μm.

The width of each of the wires 5 is in a range of, e.g., 10 to 150 μm, or preferably 20 to 100 μm. The spacing between the wires 5 is in a range of, e.g., 10 to 200 μm, or preferably 20 to 150 μm.

Figure 6I:
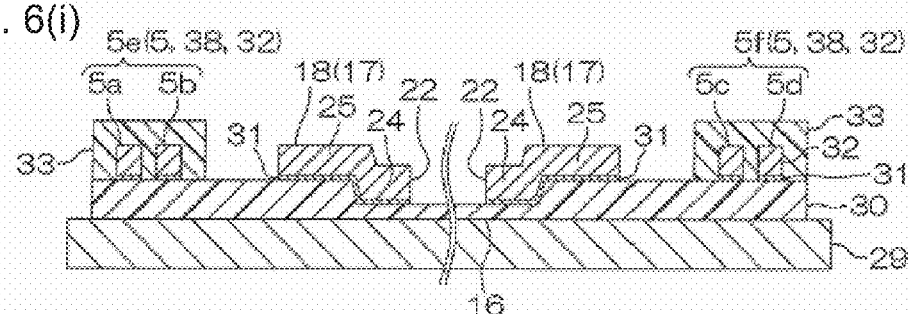
FIGS. 6(i) to 6(l) are production process views for illustrating, subsequently to FIGS. 5(e) to 5(h), the producing method of the suspension board with circuit shown in FIG. 3, 6(i) showing the step of forming an insulating cover layer on the insulating base layer, 6(j) showing the step of opening the metal supporting board to form board holes, 6(k) showing the step of opening the insulating base layer to form base holes, and 6(l) showing the step of forming a reinforcing layer.
Figure 7:
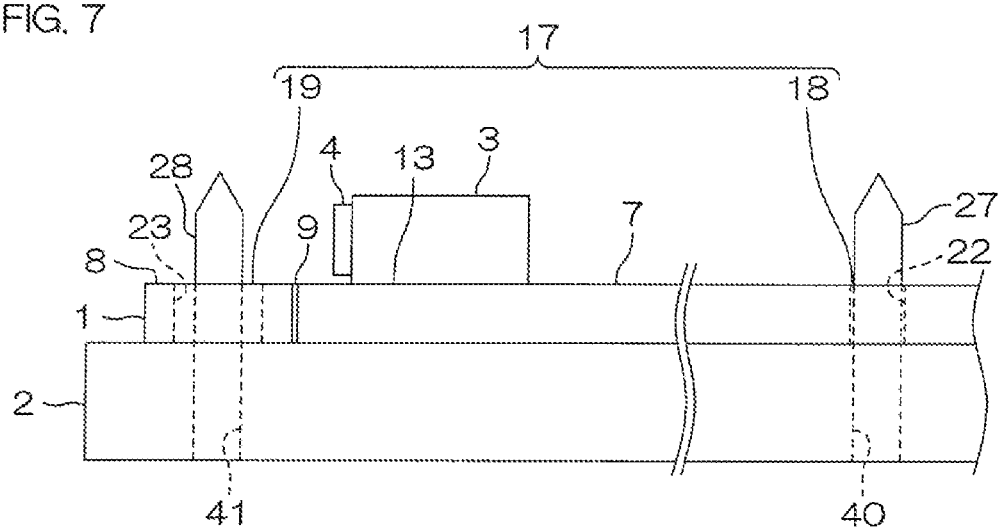
FIG. 7 is a side view for illustrating a method of placing the suspension board with circuit on a load beam.
Figure 9A:
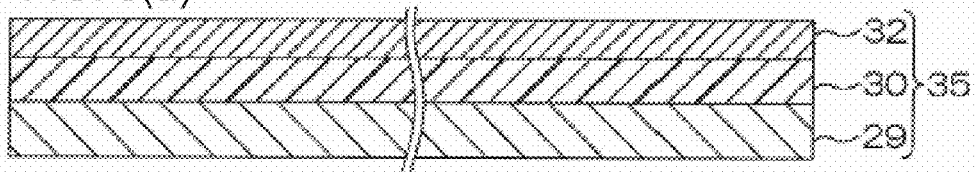
FIGS. 9(a) to 9(d) are production process views for illustrating a producing method of the suspension board with circuit shown in FIG. 8, 9(a) showing the step of preparing a three-layer base material, 9(b) showing the step of forming a photoresist on the conductive layer, 9(c) showing the step of exposing the photoresist to light via a photomask, and 9(d) showing the step of developing the photoresist to form an etching resist.
Figure 9B:
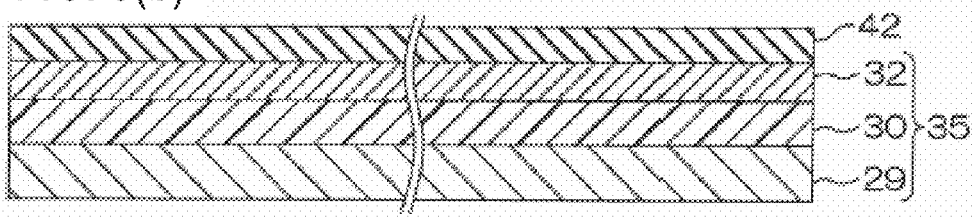
Figure 9C:
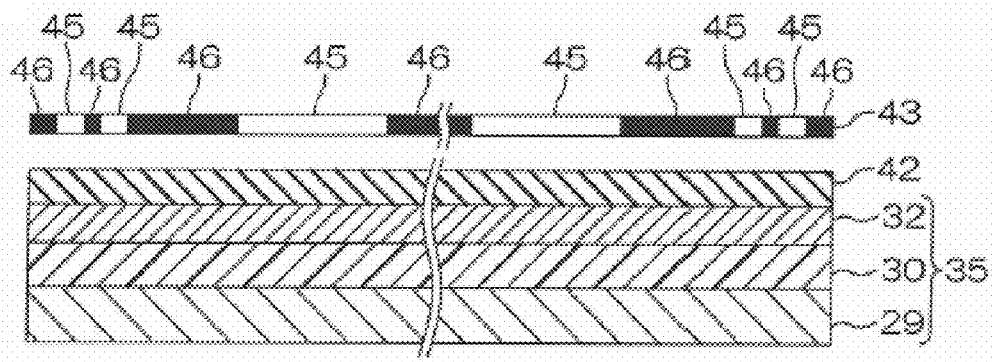
Figure 9D:
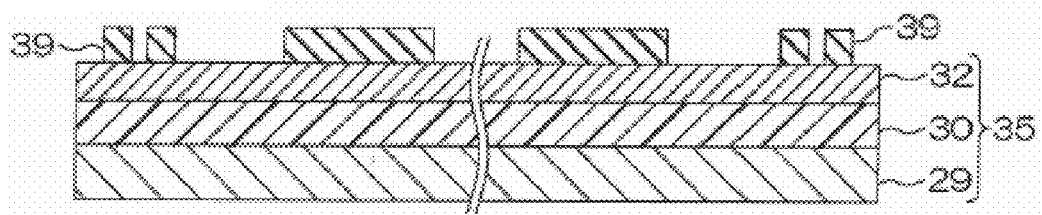

Next, as shown in FIG. 6(i), the insulating cover layer 33 is formed in the foregoing pattern on the insulating base layer 30.

As an insulating material for forming the insulating cover layer 33, the same insulating material as used to form the insulating base layer 30 mentioned above is used.

To form the insulating cover layer 33 using, e.g., photosensitive polyimide, a vanish (a solution of a photosensitive polyamic acid resin) of a photosensitive polyimide resin precursor is uniformly coated first on the surface of the insulating base layer 30 including the conductive pattern 38 and the reference portions 17, and dried by heating at, e.g., 70 to 120° C. to form a cover coating. Then, the cover coating is exposed to light via a photomask not shown, developed, and then cured (imidized) by heating at a temperature of, e.g., 300° C. or more to form the insulating cover layer 33 in the foregoing pattern.

The thickness of the insulating cover layer 33 is in a range of, e.g., 2 to 10 μm, or preferably 3 to 6 μm.

Figure 6J:
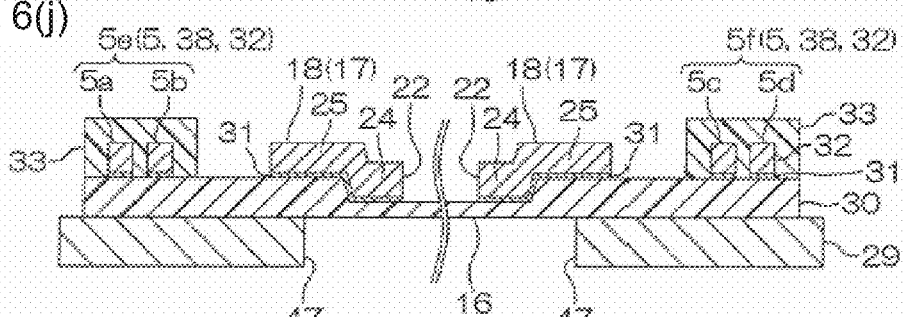

Next, as shown in FIG. 6(j), the metal supporting board 29 is opened to form the board holes 47 and the slit 14. To open the metal supporting board 29, wet etching such as, e.g., chemical etching is used. Examples of an etchant used for the wet etching include a known etchant such as an aqueous ferric chloride solution. In the wet etching, the metal supporting board 29 is covered with an etching resist except for the portions thereof corresponding to the board holes 47 and the slit 14, and then etched.

The inner diameters of the board holes 47 are in a range of, e.g., 80 to 4000 μm, or preferably 140 to 2600 μm.

Figure 6K:
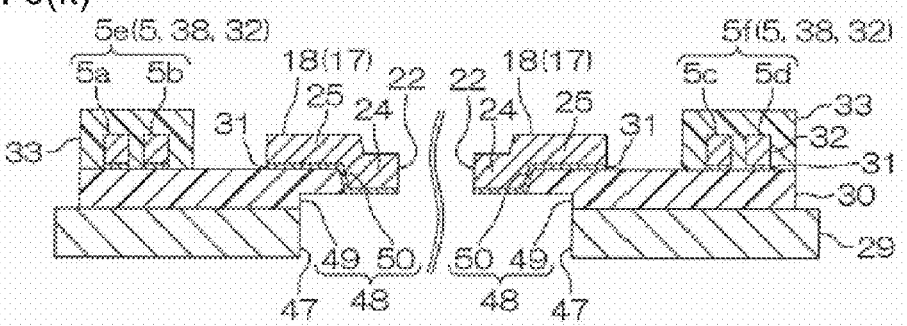

Then, as shown in FIG. 6(k), the insulating base layer 30 is opened to form the base holes 48. To open the insulating base layer 30, dry etching such as, e.g., plasma etching using the metal supporting board 29 as an etching resist (mask) is used. In the opening of the insulating base layer 30, the lower half portions of the insulating base layer 30 in the thickness direction which are at the same positions as those of the board holes 47 when viewed in bottom view are etched till the base depressed portion 16 (see FIG. 16(j)) is removed.

In this manner, the base holes 48 each including the lower hole 49 and the upper hole 50 can be formed.

The length (distance between the circumferential surface of the upper hole 50 and the circumferential surface of the lower hole 49) L1 of the protruding portion 26 is in a range of, e.g., 5 to 100 μm, or preferably 2 to 50 μm.

The length (distance between the circumferential surface of the first reference hole 22 and the circumferential surface of the upper hole 50) L2 of the inner circumferential portion 24 projecting from the protruding portion 26 is in a range of, e.g., 5 to 100 μm, or preferably 10 to 50 μm. The distance L3 between the circumferential surface of the first reference hole 22 and the circumferential surface of the board hole 47 is in a range of, e.g., 5 to 200 μm, or preferably 10 to 100 μm.

Figure 6L:
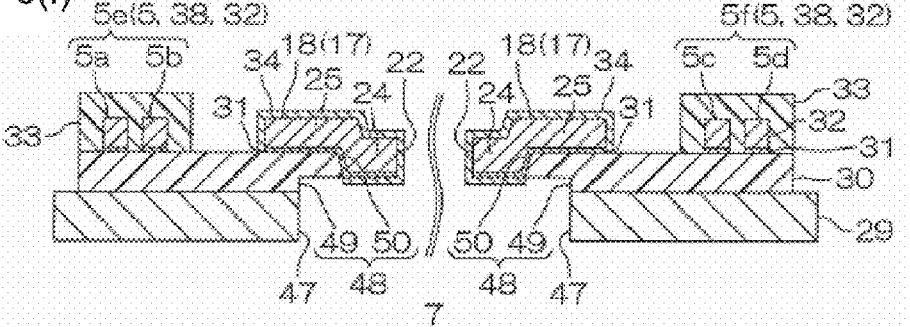

Next, as shown in FIG. 6(l), the reinforcing layer 34 is formed on the surfaces of the seed film 31 and the reference portions 17. The reinforcing layer 34 is made of, e.g., a metal material such as nickel or gold, or the same insulating material as that of the insulating base layer 30.

When the reinforcing layer 34 is made of a metal material, it is formed by, e.g., electrolytic plating or electroless plating. When the reinforcing layer 34 is formed of an insulating material, it is formed by, e.g., electro-deposition. By the electro-deposition, the reinforcing layer 34 having a uniform thickness can be formed.

The thickness of the reinforcing layer 34 thus formed is in a range of, e.g., 0.01 to 1 μm, or preferably 0.1 to 0.5 μm.

Thereafter, by trimming performed by etching or the like, the suspension board with circuit 1 including the main body portion 7, the extension portion 8, and the to-be-removed portion 9 is obtained.

Next, referring to FIG. 7, a description will be given to a positioning method of the obtained suspension board with circuit 1 with respect to the load beam 2 using the reference portions 17 as a positioning reference, and connecting the slider 3 to the conductive pattern 38.

The load beam 2 is formed in a generally flat-plate shape extending in the front-to-rear direction. In a middle portion of the load beam 2 in the front-to-rear direction, a first through hole 40 extending through the load beam 2 in the thickness direction is formed. On the side frontward of the first through hole 40, a second through hole 41 extending through the load beam 2 in the thickness direction is formed.

In the load beam 2 in which a first pin 27 is inserted in the first through hole 40 and a second pin 28 is inserted in the second through hole 41, the first pin 27 is inserted in the first reference hole 22 of the suspension board with circuit 1, and the second pin 28 is inserted in the second reference hole 23 thereof.

At this time, since the second reference hole 23 is formed as an elongated hole which is slightly long in the longitudinal direction, the extension portion 8 can freely move in the longitudinal direction correspondingly to the second reference hole 23, while it is restricted from widthwise moving with respect to the second pin 28.

On the other hand, since the first reference hole 22 is formed as a circular hole, the main body portion 7 is restricted from longitudinally and widthwise moving with respect to the first pin 27. In addition, since the extension portion 8 is formed integrally with the main body portion 7, the extension portion 8 is also restricted from longitudinally moving with respect to the first pin 27.

In this manner, the widthwise and longitudinal positioning of the extension portion 8 with respect to the load beam 2 is simultaneously performed together with the widthwise and longitudinal positioning of the main body portion 7 with respect to the load beam 2.

Then, on the gimbal 13 of the suspension board with circuit 1, the slider 3 is mounted. On the slider 3, the magnetic head 4 has been mounted, and the head-side terminals 10 (see FIG. 1) are connected to the terminals of the magnetic head 4.

Thereafter, the to-be-removed portion 9 is removed by cutting or the like to separate the extension portion 8 from the main body portion 7. Then, the slider 3, the suspension board with circuit 1, and the load beam 2 are mounted in a hard disk drive.

In the suspension board with circuit 1, the reference portions 17 are simultaneously formed together with the conductive pattern 38 from the conductive layer 32 to be in the same layer.

Accordingly, the reference portions 17 serving as the positioning reference for placing the suspension board with circuit 1 on the load beam 2, and the conductive pattern 38 (head-side terminals 10) connected to the slider 3 are relatively positioned with high accuracy.

In particular, in the method described above, the plating resist 44 is formed in the pattern in one exposure step using the single photomask 43 (see FIG. 5(e)) in which the pattern for forming the conductive pattern 38 (head-side terminals 10) and the pattern for forming the reference portions 17 are integrally formed, and then the reference portions 17 and the conductive pattern 38 are simultaneously formed in accordance with the pattern of the plating resist 44. This can allow accurate relative positioning of the head-side terminals 10 and the reference portions 17.

Therefore, according to the positioning method of the suspension board with circuit 1 described above, the suspension board with circuit 1 is positioned with respect to the load beam 2 using the first reference hole 22 and the second reference hole 23 of the reference portions 17 as the positioning reference, and the terminals of the magnetic head 4 of the slider 3 are connected to the head-side terminals 10 to allow the load beam 2, the suspension board with circuit 1, and the magnetic head 4 to be positioned relatively to each other with high positioning accuracy.

Since the first reference hole 22 and the second reference hole 23 extending through the reference portions 17 are formed in the reference portions 17 of the suspension board with circuit 1, mere insertion of the first pin 27 and the second pin 28 thereinto can allow easy positioning.

Since the base hole 48 and the board hole 47 are formed to be larger in diameter than the first reference hole 22 and the second reference hole 23, when the first pin 27 and the second pin 28 are inserted, the outer circumferential surfaces thereof are allowed to come in contact with only the inner circumferential surfaces of the first reference hole 22 and the second reference hole 23 without coming in contact with the inner circumferential surfaces of the base hole 48 and the board hole 47. As a result, the insertion of the first pin 27 and the second pin 28 into the first reference hole 22 and the second reference hole 23 can allow more precise positioning of the suspension board with circuit 1.

In the method described above, it is sufficient to form the base depressed portion 16 in the insulating base layer 30, and etch only the base depressed portion 16, i.e., only the lower portion of the insulating base layer 30 in the thickness direction in the subsequent formation of the base holes 48. This can allow a reduction in etching time and an improvement in productivity.

FIG. 8 is a cross-sectional view along the widthwise direction of the first reference portion of another embodiment of the suspension board with circuit of the present invention. FIGS. 9(a) to 11(j) are production process views for illustrating a producing method of the suspension board with circuit shown in FIG. 8. The members corresponding to the individual members described above are designated by the same reference numerals in each of the drawings referenced hereinafter, and a detailed description thereof is omitted.

In the description given above, the base depressed portion 16 is formed in the insulating base layer 30. However, as shown in FIGS. 8 to 11(*j*), the insulating base layer 30 can also be formed into a flat shape without forming the base depressed portion 16 therein.

In FIG. 8, the first reference portion 18 is formed in a generally annular ring plan view shape having a uniform thickness. The outer circumferential portion 25 of the first reference portion 18 is located on the upper surface of the inner circumferential end portion of the base hole 48 in the insulating base layer 30, while the inner circumferential portion 24 of the first reference portion 18 is located so as to inwardly project from the inner circumferential end portion of the base hole 48 in the insulating base layer 30.

The base hole 48 is formed to have a diameter which is larger than that of the first reference hole 22, and the same as that of the board hole 47. The circumferential surface of the base hole 48 is formed flush with the circumferential surface of the base hole 47 in the thickness direction.

Next, a producing method of the suspension board with circuit 1 is described with reference to FIGS. 9(*a*) to 11(*j*).

First, as shown in FIG. 9(*a*), a three-layer base material 35 in which the metal supporting board 29, the insulating base layer 30, and the conductive layer 32 are successively laminated is prepared.

Specifically, in the three-layer base material 35, the insulating base layer 30 is formed on the metal supporting board 29, and the conductive layer 32 is formed on the insulating base layer 30. A metal material for forming the metal supporting board 29, an insulating material for forming the insulating base layer 30, and a conductive material for forming the conductive layer 32 are the same as mentioned above. The thicknesses of the metal supporting board 29, the insulating base layer 30, and the conductive layer 32 are also the same as mentioned above.

Next, as shown in FIGS. 9(*b*) to 10(*f*), the conductive pattern 38 and the reference portions 17 are formed by a subtractive method.

In the subtractive method, as shown in FIG. 9(*b*), the photoresist 42 is laminated first on the conductive layer 32 (conductive layer 32 laminated on the entire upper surface of the insulating base layer 30).

Next, as shown in FIG. 9(*c*), the photoresist 42 is exposed to light via the single photomask 43. Then, as shown in FIG. 9(*d*), the photoresist 42 is developed.

Specifically, the light transmitting portions 34 of the single photomask 43 are opposed to the portions of the conductive layer 32 where the conductive pattern 38 and the reference portions 17 are to be formed, exposed to light, and then developed.

As a result, the etching resist 39 is formed in the same pattern as the conductive pattern 38 and the patterns of the reference portions 17 on the surface of the conductive layer 32.

Figure 10E:
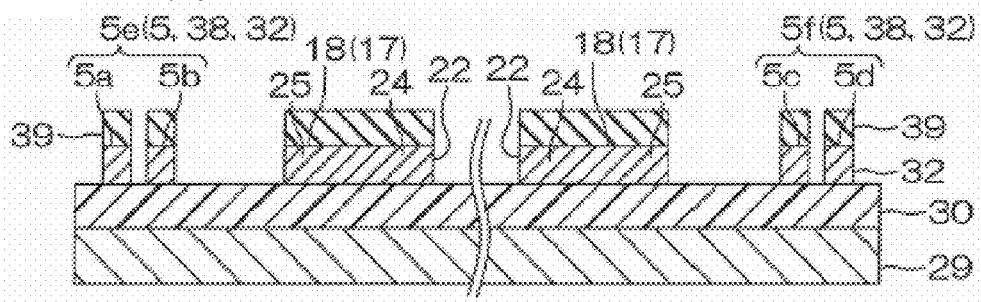
FIGS. 10(e) to 10(g) are production process views for illustrating, subsequently to FIGS. 9(a) to 9(d), the producing method of the suspension board with circuit shown in FIG. 8, 10(e) showing the step of etching the conductive layer exposed from the etching resist, 10(f) showing the step of removing the etching resist, and 10(g) showing the step of forming the insulating cover layer.
Figure 10F:
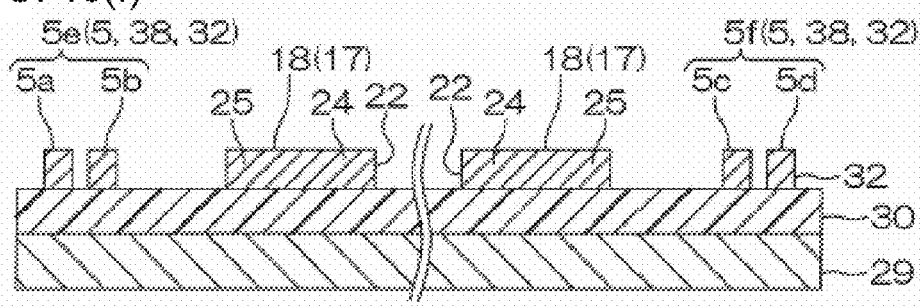
Figure 10G:
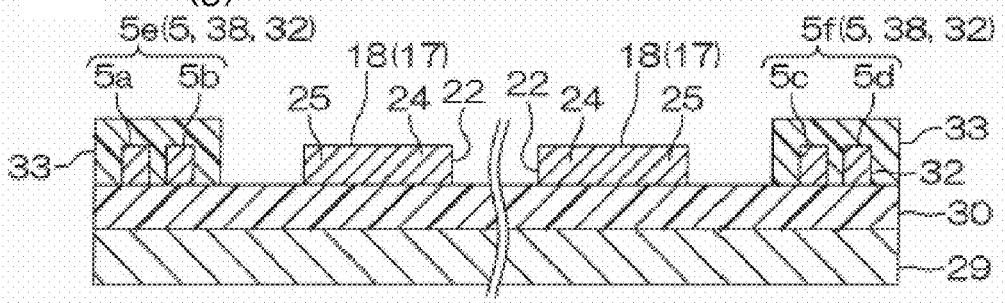

Then, as shown in FIG. 10(*e*), the conductive layer 32 exposed from the etching resist 39 is etched. For the etching of the conductive layer 32, chemical etching using an etchant, e.g., or the like is used.

In this manner, the conductive pattern 38 and the reference portions 17, each made of the conductive layer 32, are simultaneously formed.

Next, as shown in FIG. 10(*f*), the etching resist 39 is removed by, e.g., etching, stripping, or the like.

Next, as shown in FIG. 10(*g*), the insulating cover layer 33 is formed on the insulating base layer 30. To form the insulating cover layer 33, the same method as described above is used.

Figure 11H:
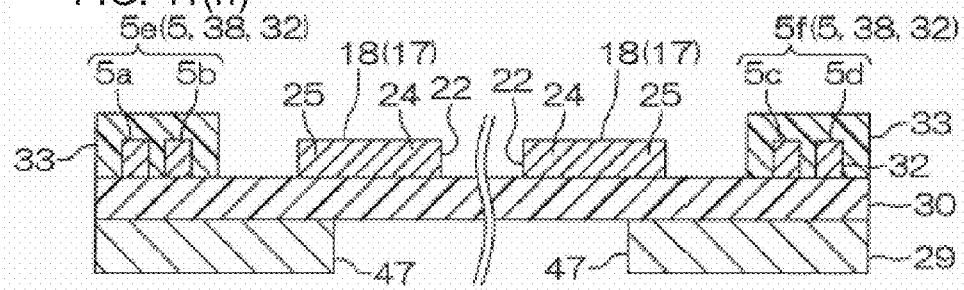
FIGS. 11(h) to 11(j) are production process views for illustrating, subsequently to FIGS. 10(e) to 10(g), the producing method of the suspension board with circuit shown in FIG. 8, 11(h) showing the step of opening the metal supporting board to form the board holes, 11(i) showing the step of opening the insulating base layer to form the base holes, and 11(j) showing the step of forming the reinforcing layer.
Figure 11I:
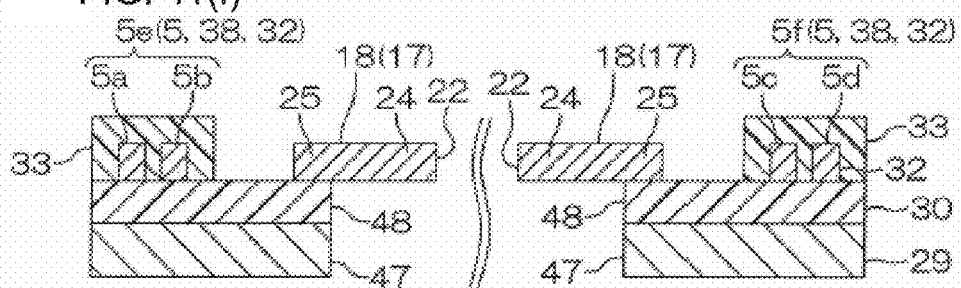
Figure 11J:
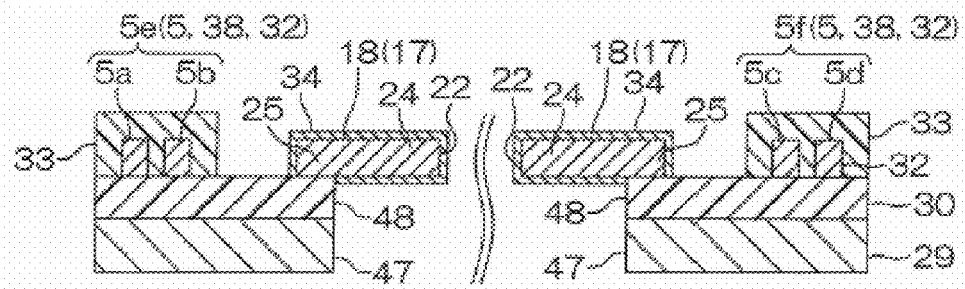

Next, as shown in FIG. 11(*h*), the metal supporting board 29 is opened to form the reference holes 47 and the slit 14.

Next, as shown in FIG. 11(*i*), the insulating base layer 30 is opened to form the base holes 48. In the opening of the insulating base layer 30, the portions of the insulating base layer 30 which are at the same positions as those of the board holes 47 in the thickness direction when viewed in plan view are entirely etched. In the etching of the insulating base layer 30, the metal supporting board 29 serves as an etching resist for preventing the insulating base layer 30 from being etched except for the portions thereof corresponding to the base holes 48.

Next, as shown in FIG. 11(*j*), the reinforcing layer 34 is formed on the surface of each of the reference portions 17.

Thereafter, by trimming performed by etching or the like, the suspension board with circuit 1 including the main body portion 7, the extension portion 8, and the to-be-removed portion 9 is obtained.

In the method described above, the conductive pattern 38 and the reference portions 17 are formed by the subtractive method using the three-layer base material 35. This can allow a reduction in the number of steps for forming the conductive layer 32 and the seed film 31.

In the description given above with reference to FIGS. 9(*a*) to 11(*j*), the conductive pattern 38 and the reference portions 17, each shown in FIG. 8, are formed by the subtractive method. However, the conductive pattern 38 and the reference portions 17 can also be formed by, e.g., the additive method described above.

FIG. 12 is a cross-sectional view along the widthwise direction of the first reference portion of still another embodiment of the suspension board with circuit of the present invention. FIGS. 13(*a*) to 13(*e*) are production process views for illustrating a producing method of the suspension board with circuit shown in FIG. 12.

In FIG. 12, the insulating base layer 30 is formed only on the portion of the main body portion 7 corresponding to the conductive pattern 38.

The first reference portion 18 is formed on the upper surface of the seed film 31 as the via layer.

Specifically, the outer circumferential portion 25 of the first reference portion 18 is located on the inner circumferential end portion of the board hole 47 in the metal supporting board 29 via the seed film 31. The inner circumferential portion 24 of the first reference portion 18 is located to inwardly project from the inner circumferential end portion of the board hole 47 in the metal supporting board 29, and have the lower surface thereof covered with the seed film 31.

The seed film 31 has the inner circumferential surface thereof defining a seed film hole 21 as the via hole extending through the seed film 31 in the thickness direction. The seed film hole 21 is formed at the same position as that of the first reference hole 22 when viewed in bottom view (when projected in the thickness direction).

A material for forming the seed film 31 is selected appropriately in accordance with an etchant used in an etching step (see FIG. 13(*d*)) described later. For example, a material (such as, e.g., chromium) resistant to the etchant is selected.

Next, a producing method of the suspension board with circuit 1 is described with reference to FIGS. 13(*a*) to 13(*e*).

Figure 13A:
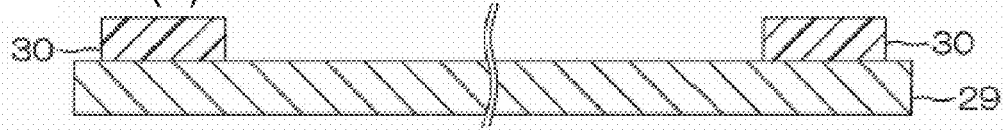
FIGS. 13(a) to 13(e) are production process views for illustrating a producing method of the suspension board with circuit shown in FIG. 12, 13(a) showing the step of forming the insulating base layer on the metal supporting board, 13(b) showing the step of forming a conductive pattern and the reference portions, 13(c) showing the step of forming the insulating cover layer on the insulating base layer, 13(d) showing the step of opening the metal supporting board to form the board holes, and 13(e) showing the step of forming the reinforcing layer.

In the method, as shown in FIG. 13(a), the metal supporting board 29 is prepared first. Then, the insulating base layer 30 is formed in a pattern corresponding to the conductive pattern 38 mentioned above on the metal supporting board 29.

Figure 13B:
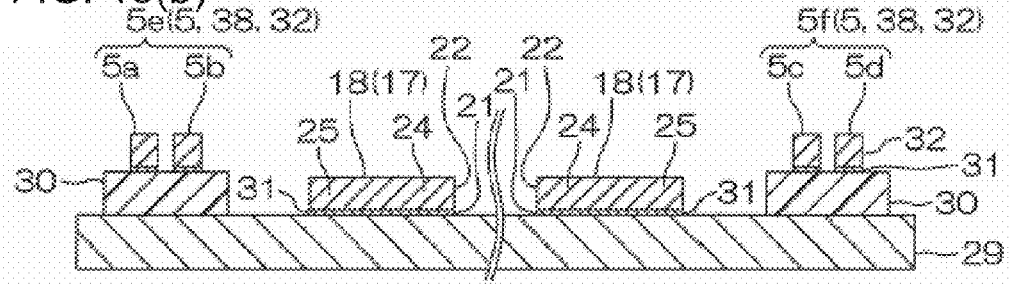

Next, as shown in FIG. 13(b), the seed film 31 is formed on the insulating base layer 30 and on the metal supporting board 29 by the additive method, then the conductive pattern 38 is formed on the seed film 31 on the insulating base layer 30, and then the reference portions 17 is formed on the seed film 31 on the metal supporting board 29.

Figure 13C:
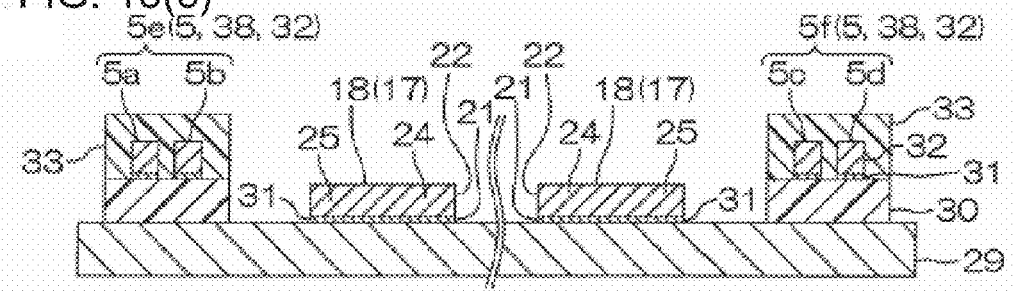

Next, as shown in FIG. 13(c), the insulating cover layer 33 is formed on the insulating base layer 30.

Figure 13D:
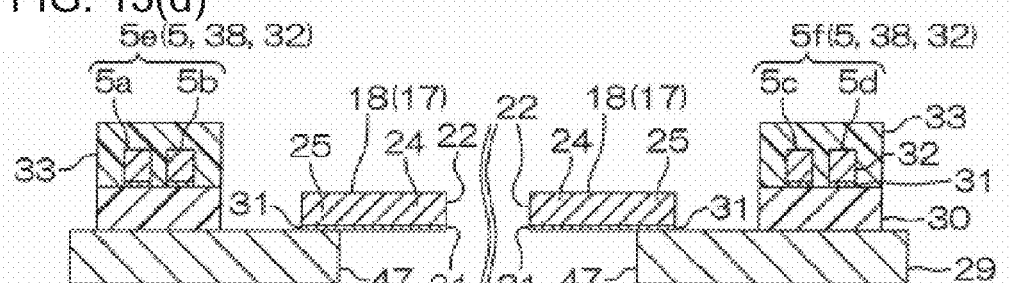

Next, as shown in FIG. 13(d), the metal supporting board 29 is opened to form the board holes 47 and the slit 14. In wet etching for opening the metal supporting board 29, the seed film 31 serves as an etching resist for preventing the etching of the reference portions 17.

Figure 13E:
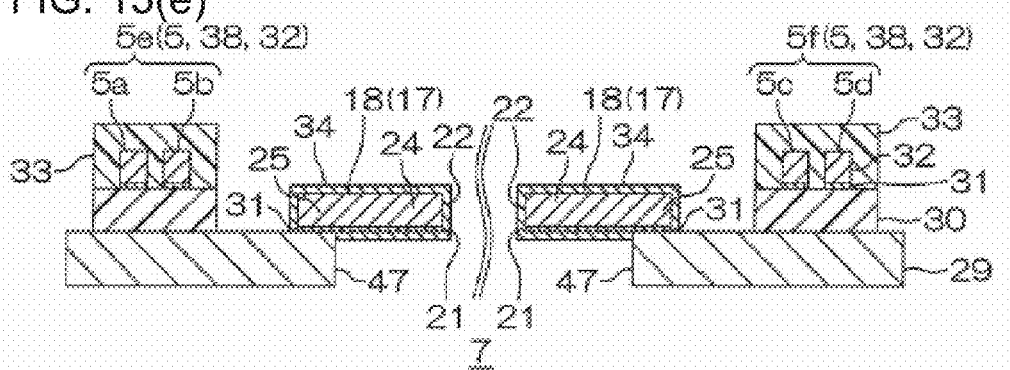

Then, as shown in FIG. 13(e), the reinforcing layer 34 is formed on the surfaces of the seed film 31 and the reference portions 17.

Thereafter, by trimming performed by etching or the like, the suspension board with circuit 1 including the main body portion 7, the extension portion 8, and the to-be-removed portion 9 is obtained.

In the method, the insulating base layer 30 is not formed under either of the reference portions 17. This can allow omission of the step of forming the base holes 48 in the insulating base layer 30.

In the suspension board with circuit 1, the first reference hole 22 is formed at the same position as that of the seed film hole 21 when viewed in bottom view. This can allow sufficient protection of the lower surface of the inner circumferential portion 24 of the first reference portion 18.

In the description given above, the first reference portion 18 is formed in a generally annular ring plan view shape, and the second reference portion 19 is formed in an elongated-hole frame shape when viewed in plan view. However, it is also possible to form the first reference portion 18 and the second reference hole 19 in, e.g., mutually reverse shapes, though not shown. It is further possible to form both of the first reference portion 18 and the second reference portion 19 in a generally annular ring plan view shape or in an elongated-hole frame shape when viewed in plan view.

Preferably, at least one of the first reference portion 18 and the second reference hole 19 is formed in a generally annular ring plan view shape. This ensures longitudinal positioning of the suspension board with circuit 1 with respect to the pins.

FIGS. 14(a) to 14(e) are enlarged plan views of the first reference portion of yet another embodiment of the suspension board with circuit of the present invention.

The reference portions 17 can also be formed in appropriate shapes other than the shapes mentioned above.

Figure 14A:
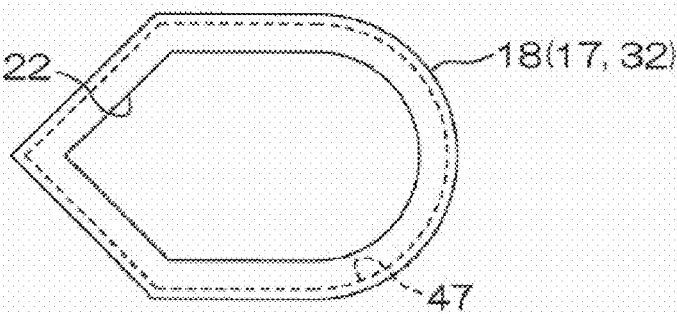
FIGS. 14(a) to 14(e) are enlarged plan views of the reference portions of yet another embodiment of the suspension board with circuit of the present invention.
Figure 14B:
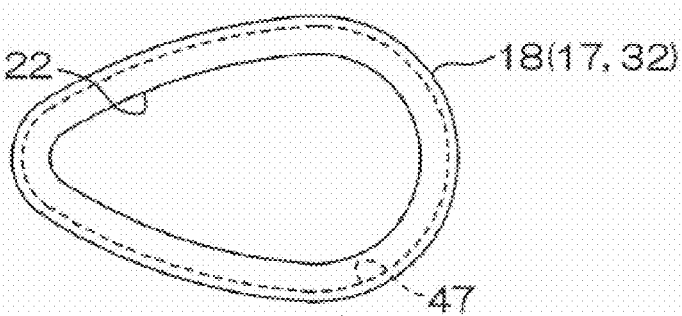
Figure 14C:
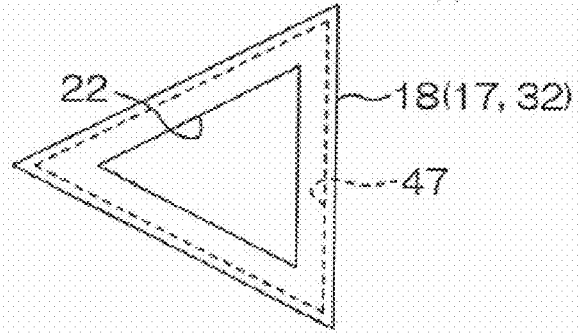
Figure 14D:
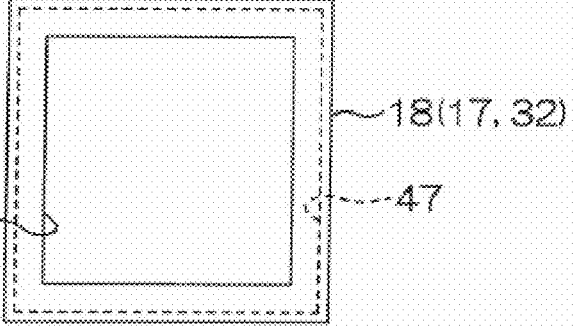

For example, the reference portions 17 can be each formed in a plan view shape which is triangular on the front side and in a U-shaped shape on the rear side as shown in FIG. 14(a), in an ellipsoidal plan view shape (an oval plan view shape having an apex located on the front side) which is tapered toward the front side as shown in FIG. 14(b), in a triangular plan view shape (an equilateral triangular plan view shape having an apex located on the front side) as shown in FIG. 14(c), or in a rectangular plan view shape (e.g., a square) as shown in FIG. 14(d).

When the reference portions 17 are each formed in a triangular plan view shape (see FIG. 14(c)) or a square plan view shape (see FIG. 14(d)) each having an inscribed circle, precise positioning can be performed by inserting cylindrical pins (the first pin 27 and the second pin 28) into the reference portions 17.

Preferably, one of the two reference portions 17 is formed in an annular ring shape, and the other thereof is formed in an elongated-hole frame shape.

In the description given above, the two reference portions 17 are provided. However, the number of the reference portions is not particularly limited. It is also possible to provide, e.g., one reference portion, or three or more reference portions. When one reference portion is provided, it is preferably provided at the extension portion 8. Since the extension portion 8 is close to the head-side terminals 10, the slider 3 can be accurately mounted.

In the description given above, the reference portions 17 are formed continuously in a circumferential direction. However, the reference portions 17 can also be, e.g., formed discontinuously in the circumferential direction, as shown in FIG. 14(e).

Figure 14E:
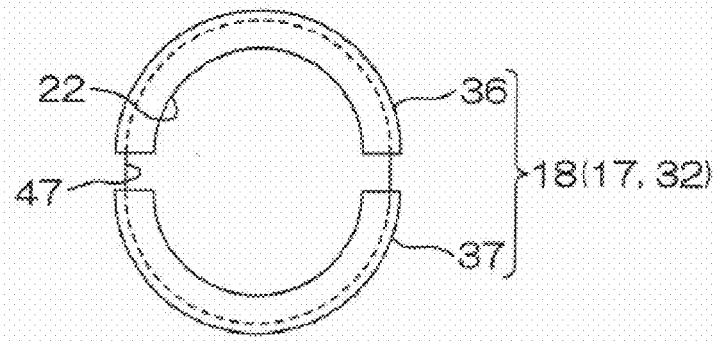

In FIG. 14(e), the reference portions 17 can be each formed in a shape which is divided into a first semi-arcuate portion 36 located on one widthwise side, and a second semi-arcuate portion 37 on the other widthwise side.

In the description given above, the reference portions 17 are provided on the surface (upper surface) of the metal supporting board 2. However, the reference portions 17 can also be provided on the both surfaces (the upper and lower surfaces) of the metal supporting board 2.

Further, when the wires 5 of the conductive pattern 38 are divided in two layers in the thickness direction which are disposed to oppose each other in the thickness direction, i.e., when a second insulating layer is provided on each of the lower wires 5, and the upper wires 5 are provided on the second insulating base layer, the reference portions 17 are formed from the conductive layer 32 in the same layer as those of the head-side terminals 10. This can allow accurate relative positioning of the head-side terminals 10 and the reference portions 17.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A suspension board with circuit in combination with a load beam having at least one through hole configured to receive a pin, the suspension board with circuit comprising:
    a metal supporting board;
    a conductive layer laminated on the metal supporting board;
    a via layer interposed between the metal supporting board and the conductive layer; and
    a reinforcing layer made of a metal material,
    wherein the conductive layer includes a conductive pattern, and a positioning reference hole which is a positioning reference configured to position the suspension board with circuit on the pin on condition that the pin is inserted in the at least one through hole of the load beam thereby to mount the suspension board with circuit to the load beam,
    wherein the positioning reference hole extends through the conductive layer in a thickness direction,
    wherein the conductive layer comprises a terminal,
    wherein the positioning reference hole is formed at a position different from that of the terminal, and wherein the reinforcing layer is formed on a surface of the conductive layer forming the positioning reference hole.

2. The suspension board with circuit in combination with the load beam according to claim 1, wherein
a via hole is formed in the via layer to extend therethrough in the thickness direction,
the via hole is formed at the same position as that of the positioning reference hole, or includes the positioning reference hole when projected in the thickness direction,
a board hole is formed in the metal supporting board to extend therethrough in the thickness direction, and
the board hole includes the positioning reference hole when projected in the thickness direction.

3. The suspension board with circuit in combination with the load beam according to claim 1,
wherein a via hole extending through the via layer in the thickness direction is formed, the via hole including the positioning reference hole when projected in the thickness direction,
wherein the conductive layer forming the positioning reference hole integrally includes an outer circumferential portion located on an upper surface of the via layer around the via hole in the via layer and an inner circumferential portion inwardly projecting from an inner circumferential surface of the via hole in the via layer,
wherein the inner circumferential portion is located to be lower by one step in level than the outer circumferential portion, and
wherein the positioning reference hole is defined by an inner circumferential surface of the inner circumferential portion.

4. The suspension board with circuit in combination with the load beam according to claim 3,
wherein a board hole extending through the metal supporting board in the thickness direction is formed, the board hole including the positioning reference hole when projected in the thickness direction,
wherein the via layer includes a protruding portion inwardly projecting relative to the board hole and forms an innermost portion of the via hole,
wherein a lower surface of the inner circumferential portion is formed so as to be flush with a lower surface of the protruding portion.

5. The suspension board with circuit in combination with the load beam according to claim 1,
wherein a via hole extending through the via layer in a thickness direction is formed, the via layer including the positioning reference hole when projected in the thickness direction,
wherein a board hole extending through the metal supporting board in a thickness direction is formed, the board hole including the positioning reference hole when projected in the thickness direction, and
wherein the via layer includes a protruding portion inwardly projecting relative to the board hole and forms an innermost portion of the via hole.

* * * * *